(12) United States Patent
Honda

(10) Patent No.: US 6,469,257 B2
(45) Date of Patent: Oct. 22, 2002

(54) INTEGRATED CIRCUIT PACKAGES

(75) Inventor: Shinji Honda, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/026,924

(22) Filed: Dec. 18, 2001

(65) Prior Publication Data
US 2002/0100971 A1 Aug. 1, 2002

(30) Foreign Application Priority Data
Dec. 27, 2000 (JP) ......................................... 2000-397983

(51) Int. Cl.[7] ................................................. H05K 1/09
(52) U.S. Cl. ........................ 174/255; 174/260; 361/760; 439/69
(58) Field of Search .............................. 439/68, 69, 72; 174/255, 260; 361/760, 772, 773, 774

(56) References Cited

U.S. PATENT DOCUMENTS 4,717,346 A * 1/1988 Yoshizaki .................... 439/71
4,747,017 A * 5/1988 Koors et al. .................. 439/68
4,830,622 A * 5/1989 Erickson et al. .............. 439/64
6,179,623 B1 * 1/2001 Pei .............................. 439/70

* cited by examiner

Primary Examiner—Albert W. Paladini
(74) Attorney, Agent, or Firm—Hogan & Hartson, LLP

(57) ABSTRACT

An integrated circuit package is mounted on a socket pedestal. External terminals such as ball electrodes may be provided in an array on a mounting surface. Recessed sections can also be provided in the mounting surface in a peripheral section of a region where the external terminals are arranged. The recessed sections can be used for positioning. When the integrated circuit package is subject to an electrical characteristic test (or a burn-in test), the recessed sections can be coupled to protrusions provided on a side of a socket and positioned. As a result, the external terminals can be securely and accurately connected to socket terminals. Thus, integrated circuit packages are provided which have arrayed electrodes for face-down mounting, and which improves the connection accuracy with respect to a socket for conducting electrical characteristic tests.

20 Claims, 3 Drawing Sheets (a)

(b)

(a)

(b)

INTEGRATED CIRCUIT PACKAGES

BACKGROUND OF THE INVENTION

The present invention relates to integrated circuit packages and more particularly to integrated circuit packages that exhibit improved connection accuracy with respect to a socket.

Mass-produced integrated circuit package-type devices are typically subject to numerous electrical characteristic tests and burn-in tests when being packaged. During these tests such integrated circuit packages are typically brought into contact with a socket. Accordingly, during testing it is important that integrated circuit packages are accurately connected to a socket pedestal located at a measurement section of an integrated circuit measurement apparatus.

FIG. 3 schematically shows a conventional integrated circuit package 30. The integrated circuit package 30 shown can be, for example, a face-down mounting ball grid array (BGA) type or a chip size package (CSP) type, that is mounted on a socket pedestal 35. External terminals 31 such as ball electrodes of the integrated circuit package 30 are disposed in an array on a facedown mounting surface and electrically connected to socket terminals 36, respectively.

The integrated circuit package 30 uses a socket frame 37 for positioning itself with respect to the socket pedestal 35. In other words, the positioning is conducted in a manner such that corner sections of the integrated circuit package 30 are inserted in the socket frame 37.

As integration density increases and integrated circuit chips continue to reduce in size, integrated circuit package products such as the BGA type or CSP type discussed above, typically have smaller face-down mounting areas. As the number of external terminals increases, arrangement pitch of the terminals tends to become narrower. As a result, it may be difficult to achieve a stable electrical connection between the external terminals 31 and the socket terminals 36 during positioning of the integrated circuit package 30.

SUMMARY OF THE PREFERRED EMBODIMENTS

An aspect of the present invention provides an integrated circuit package including an array of external terminals, and a plurality of recessed sections. The array of external terminals is adapted to be connected to corresponding socket terminals. The plurality of recessed sections is adapted to be coupled to protrusions of a socket pedestal during connection of the external terminals to the corresponding socket terminals.

Another aspect of the present invention provides an integrated circuit package including external terminals and recessed sections for positioning. The external terminals are adapted to be electrically connected to an integrated circuit chip and provided in an array on a mounting surface. The recessed sections for positioning may be provided in at least two locations in the mounting surface at a periphery of a region where the external terminals are arranged. When at least the external terminals are connected to socket terminals for signal transmission, the recessed sections are coupled to the protrusions on a socket side and positioned.

DETAILED DESCRIPTION OF THE PREFERRED EMBODIMENTS

Figure 1:
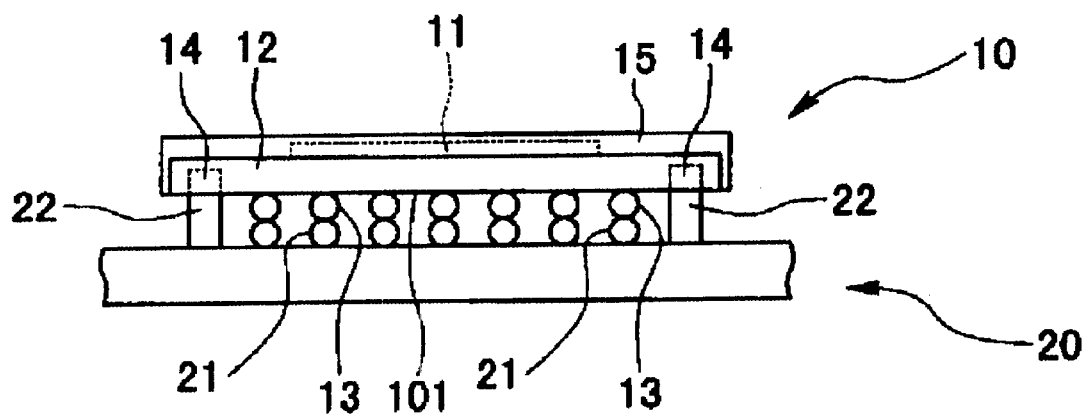
FIGS. 1(a) and (b) respectively show general views of main sections of integrated circuit packages in accordance with a preferred aspect of the present invention.
Figure 1:
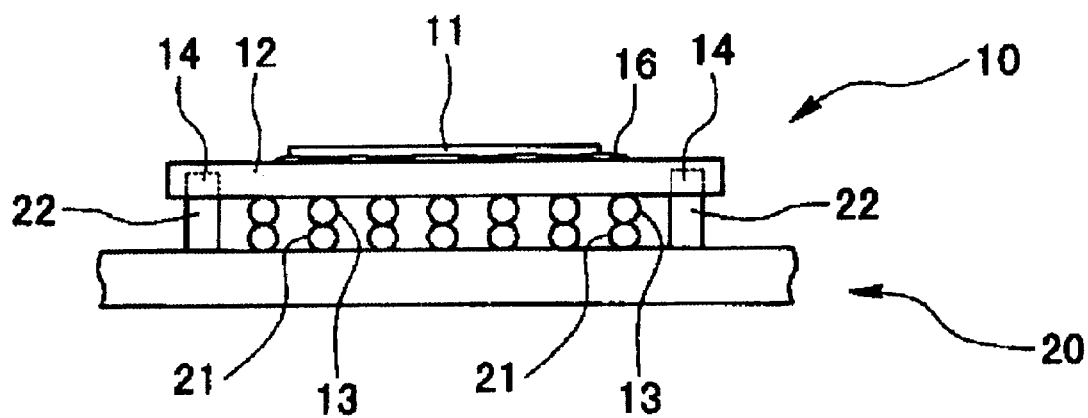

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element such as a layer, region or substrate is referred to as being "connected to" another element, it can be directly connected to the other element or intervening elements may also be present. In contrast, when an element is referred to as being "directly connected to" another element, there are no intervening elements present. When an element such as a layer, region or substrate is referred to as being "adjacent" to another element, it can be near the other element but not necessarily independent of the other element. When an element such as a layer, region or substrate is referred to as being "between" two things, it can be either partly of completely between those two things, but is not necessarily completely and continuously between those two things. The term "adapted to" should be construed to mean "capable of".

According to preferred implementations of the present invention, integrated circuit packages can be provided that have arrayed electrodes for face-down mounting, and that are adapted to improve the connection accuracy with respect to a socket when conducting electrical characteristic tests. Recessed sections for positioning are provided adjacent to a region where the external terminals are arranged. As a result, connection and positioning accuracy with respect to the socket terminals are improved. Also, the insertion depth can be controlled to a degree by the depth of the recessed sections, such that the likelihood of excessive connection pressure in the socket terminals is reduced and/or prevented. It is noted that each of the recessed sections described above may be diagonally provided on the mounting surface in order to further improve positioning accuracy.

FIGS. 1(a) and (b) respectively show general views of main portions of integrated circuit packages in accordance with preferred aspects of the present invention. In these structures, a BGA type or CSP type integrated circuit package, for example, can be mounted on and connected to a socket pedestal. Referring to FIG. 1(a) (or (b)), a socket pedestal 20 is equipped with socket terminals 21 arranged to correspond to external terminals 13 of an integrated circuit package 10 such as ball electrodes. The entire external terminals 13 are connected to the socket terminals 21 for signal transmission upon electrical characteristic tests such as measurement examinations and burn-in tests such as examinations under specified temperatures and voltage conditions. Although not shown in the figure, the socket pedestal 20 is adapted to provide signal transmission with a tester through, for example, a socket board or a performance board.

The integrated circuit package 10 has a mounting surface 101 on which the external terminals 13 are provided in an array. The external terminals 13 are electrically connected to electrodes (not shown) of an integrated circuit chip 11, respectively, through a wiring substrate 12. As shown in FIG. 1(a), the integrated circuit chip 11 can be covered by a sealing material 15 that is formed on the wiring substrate 12. Alternatively, as shown in FIG. 1(b), a connection section of the integrated circuit chip 11 with the wiring substrate 12 may be protected by a sealing material 16.

Referring to FIG. 1(a) (or (b)), recessed sections 14, shown as convex-shaped in this implementation, are provided in the mounting surface 101 along a periphery of a region where the external terminals 13 are arranged. The recessed sections 14 are used for positioning. When the integrated circuit package 10 is subject to testing such as electrical characteristic tests and burn-in tests, protrusions 22 on a socket side can be inserted in the recessed sections 14 and positioned. Accordingly, the external terminals 13 may be more securely connected to the corresponding socket terminals 21.

The socket pedestal 20 has socket terminals 21 provided in a manner to correspond to the arrangement of the external terminals 11 of the integrated circuit package 10, as well as the protrusions 22 for positioning, as described above. The recessed sections 14 can be coupled with protrusions 22, to thereby accurately position the integrated circuit package 10.

The recessed sections for positioning 14 are preferably provided adjacent to the region in which the external terminals 13 are arranged. Accordingly, connecting and positioning accuracy with respect to the socket terminals 21 may be improved compared to rough positioning used with a conventional socket frame.

Although not shown in the figures, a pressure connection method can be used to press the integrated circuit package 10 against the socket pedestal 20. The insertion depth of the protrusions can be controlled based on depth of the recessed sections 14 to reduce and/or prevent excessive connection pressure on the socket terminals 21.

FIG. 2(a) shows a plan view of one example of a mounting surface of either a BGA type or CSP type integrated circuit package described above. FIG. 2(b) schematically shows a side view.

Figure 2:
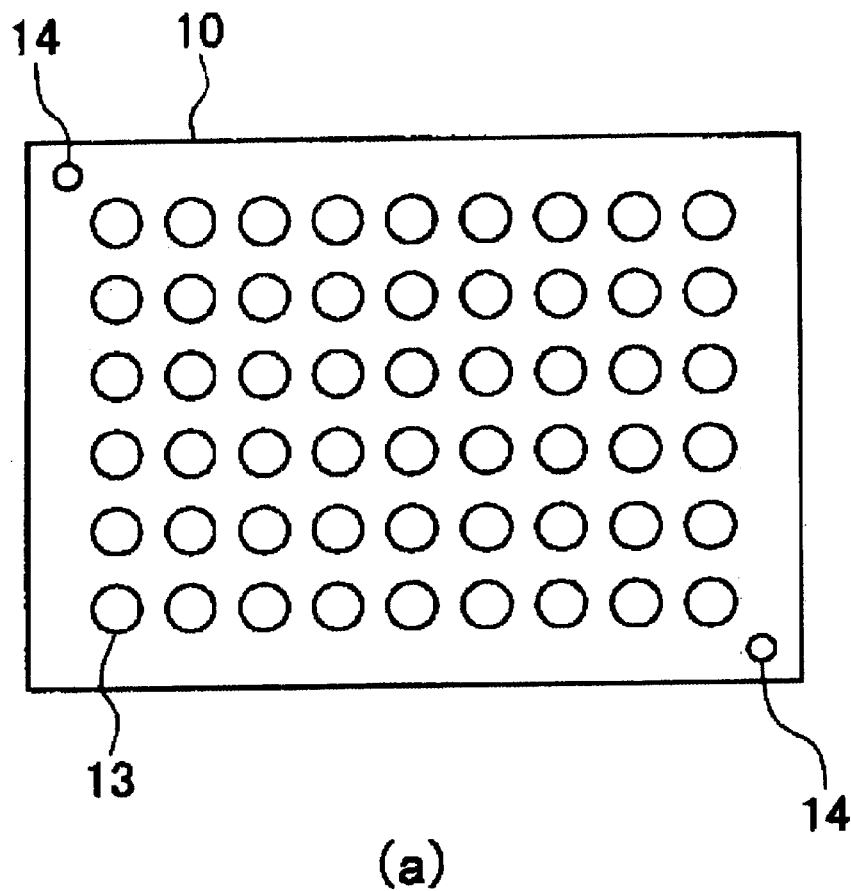
FIG. 2(a) shows a plan view and FIG. 2(b) shows a side view of one example of a mounting surface of an integrated circuit package of BGA type (or CSP type) in accordance with the preferred aspect of the present invention shown in FIG. 1(a) and (b), respectively.
Figure 2:
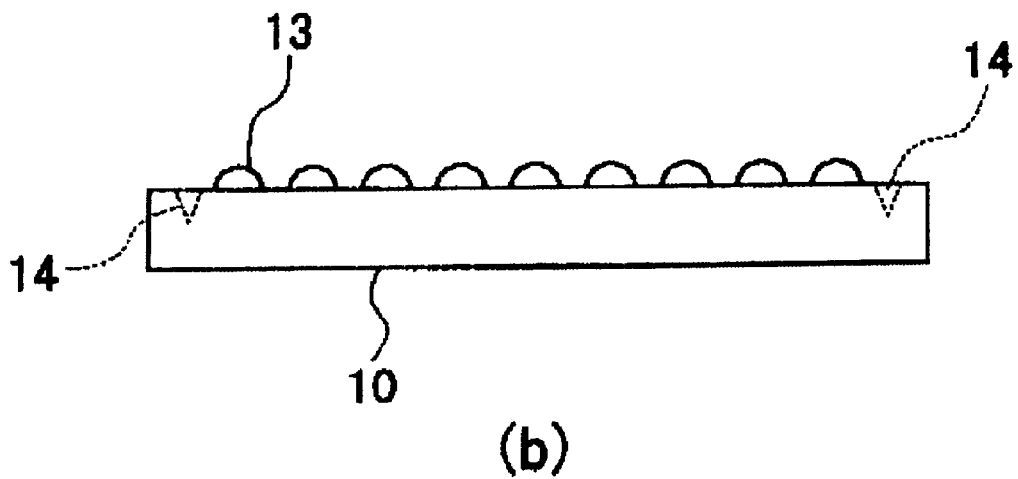
Figure 3:
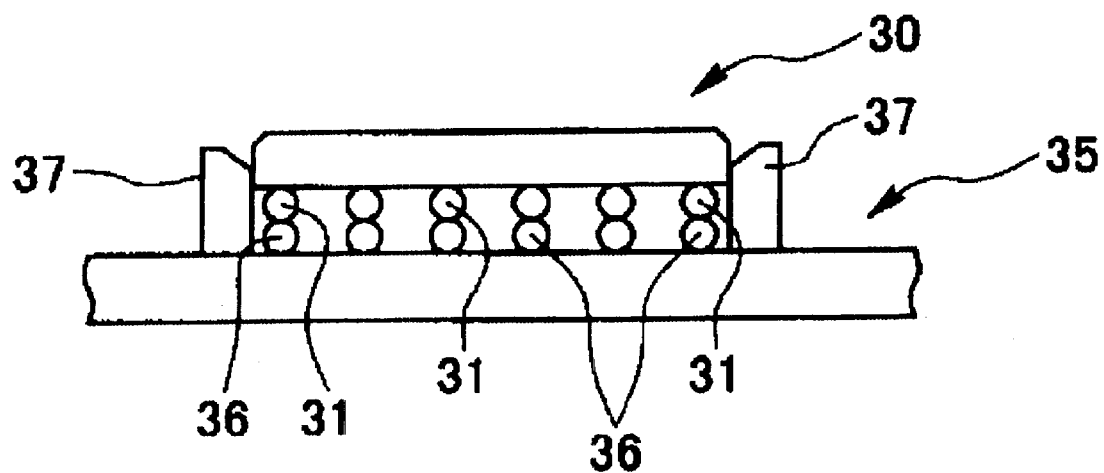
FIG. 3 schematically shows an example of a conventional integrated circuit package.

The mounting surface 101 of the integrated circuit package 10 has a region where the external terminals 13, such as ball electrodes, can be arranged. As shown in FIG. 2(a), each of the recessed sections 14 can be provided opposed in a diagonal direction in a peripheral area of the region. The positioning recessed sections 14 can thus be provided in a diagonal direction thereof to improve the positioning accuracy and reduce and/or prevent the recessed sections from moving around after they are positioned. The recessed section 14 can be formed of a conical convex that gradually increases the positioning precision. Although not shown in the figures, the recessed sections 14 may be provided on both of the diagonal lines, in other words, at four corners of the package 10. However, the arrangement shown in FIG. 2 can eliminate the risk of placing the socket in a wrong direction. The recessed section 14 may have any one of a variety of shapes that allow the recessed section 14 to be appropriately coupled to a protrusion on the socket side.

As described above, preferred aspects of the present invention can provide recessed sections for positioning at specified locations adjacent a region where the external terminals are arranged, and coupled to and positioned with respect to protrusions provided on a socket side. Connection and positioning accuracy with respect to socket terminals can thus be improved. Also, insertion depth can be controlled by the depth of the recessed sections such that the socket terminals are prevented from an excessive connection pressure. As a result, a highly reliable integrated circuit package can be provided which has arrayed electrodes for face-down mounting, and which improves the connection accuracy with respect to a socket for conducting electrical characteristic tests.

While the present invention has been described in terms of certain preferred embodiments, those of ordinary skill will appreciate that certain variations, extensions and modifications may be made without varying from the basic teachings of the present invention. As such, the present invention is not to be limited to the specific preferred embodiments described therein. Rather, the scope of the present invention is to be determined from the claims, which follow.

What is claimed is:

1. An integrated circuit package, comprising:

an array of external integrated circuit terminals on a mounting surface of the integrated circuit package, the array of external terminals adapted to be connected to corresponding socket terminals; and a plurality of recessed sections adapted to be coupled to protrusions of a socket pedestal during connection of the external terminals to the corresponding socket terminals, wherein the recessed sections are disposed along the mounting surface in a peripheral region of the external terminals.

2. An integrated circuit package according to claim 1, wherein the recessed sections are provided diagonally on the mounting surface with respect to each other.

3. An integrated circuit package according to claim 1, further comprising:

a sealing material.

4. An integrated circuit package according to claim 1, wherein each of the recessed sections is convex-shaped.

5. An integrated circuit package according to claim 1, wherein the integrated circuit package is a ball-grid-array type integrated circuit package.

6. An integrated circuit package according to claim 1, wherein the integrated circuit package is a chip-size-package type integrated circuit package.

7. An integrated circuit package, comprising:

an array of external integrated circuit terminals on a mounting surface of the integrated circuit package, the array of external terminals adapted to be connected to corresponding socket terminals; and a plurality of recessed sections adapted to be coupled to protrusions of a socket pedestal during connection of the external terminals to the corresponding socket terminals.

8. An integrated circuit package according to claim 7, wherein the recessed sections are provided diagonally on the mounting surface with respect to each other.

9. An integrated circuit package according to claim 7, further comprising:

a sealing material.

10. An integrated circuit package according to claim 7, wherein each of the recessed sections is convex-shaped.

11. An integrated circuit package according to claim 7, wherein the integrated circuit package is a ball-grid-array type integrated circuit package.

12. An integrated circuit package according to claim 7, wherein the integrated circuit package is a chip-size-package type integrated circuit package.

13. An integrated circuit package according to claim 7, wherein the recessed sections are disposed along the mounting surface in a peripheral region of the external terminals.

14. An integrated circuit package, comprising:

an array of external terminals adapted to be connected to corresponding socket terminals; and a plurality of recessed sections adapted to be coupled to protrusions of a socket pedestal during connection of the external terminals to the corresponding socket terminals.

15. An integrated circuit package according to claim 14, wherein the array of external integrated circuit terminals are disposed on a mounting surface of the integrated circuit package, and wherein the recessed sections are disposed along the mounting surface in a peripheral region of the external terminals.

16. An integrated circuit package according to claim 15, wherein the recessed sections are provided diagonally on the mounting surface with respect to each other.

17. An integrated circuit package according to claim 14, further comprising:

a sealing material.

18. An integrated circuit package according to claim 14, wherein each of the recessed sections is convex-shaped.

19. An integrated circuit package according to claim 14, wherein the integrated circuit package is a ball-grid-array type integrated circuit package.

20. An integrated circuit package according to claim 14, wherein the integrated circuit package is a chip-size-package type integrated circuit package.

* * * * *